United States Patent [19]

Napoli et al.

[11] 3,898,353

[45] Aug. 5, 1975

[54] SELF ALIGNED DRAIN AND GATE FIELD EFFECT TRANSISTOR

[75] Inventors: Louis Sebastian Napoli, Hamilton Square; Walter Francis Reichert, East Brunswick, both of N.J.

[73] Assignee: The United States of America as represented by the Secretary of the Army, Washington, D.C.

[22] Filed: Oct. 3, 1974

[21] Appl. No.: 511,858

[52] U.S. Cl. ...................... 427/89; 29/571; 156/11; 156/17; 427/91; 427/250

[51] Int. Cl.[2]..... B44D 1/18; C23B 5/50; C23B 5/64

[58] Field of Search ....... 117/212, 217, 107, 106 A, 117/119; 156/8, 11, 17; 29/571

[56] References Cited

UNITED STATES PATENTS 3,837,907 9/1974 Berglund et al. .................. 117/212

*Primary Examiner*—William A. Powell

*Attorney, Agent, or Firm*—Nathan Edelberg; Robert P. Gibson; Michael J. Zelenka

[57] ABSTRACT

A method for manufacturing a field effect transistor device utilizing the intentional buildup of material on the source region of the device to mask the gate region of the device and obtain an edge on the drain region which closely follows the contour of the edge on the source region thus permitting a narrow, constant width gate region and more uniform capacitance and current flow between the source and drain regions. The material buildup on the source region of the device is a film of metal which is evaporated on a semiconductor wafer so as to define a pattern with one straight edge.

1 Claim, 6 Drawing Figures

SELF ALIGNED DRAIN AND GATE FIELD EFFECT TRANSISTOR

BACKGROUND OF THE INVENTION

The present invention relates to the fabrication of semiconductor devices and particularly to the fabrication of field effect transistors utilizing masking techniques in their construction. In the area of field effect transistor manufacture it has been general practice to employ photographic masks during fabrication. This technique has been unsatisfactory in that when utilized for fabricating high frequency devices where the separation between the source and drain regions of the device must be kept small and constant it becomes extremely difficult, and not cost effective, to maintain parallel edges by the use of masks. Keiichi Nakamura and Yoshiyasu Kuroo proposed a new technique in U.S. Pat. No. 3,387,360, dated June 11, 1968, in which a step in the semiconductor material is utilized to mask conductor material immediately adjacent to the step. This technique has not been applied to high frequency field effect transistors however as it proved difficult to step semiconductor material in a line sufficiently straight to realize gate regions in the order of one micron in width.

SUMMARY OF THE INVENTION

The general purpose of this invention is to provide a technique for the manufacture of a field effect transistor which is suitable for high frequency use and which can be fabricated on a production basis at a reasonable cost. This is accomplished by the utilization of a buildup of material on the semiconductor wafer which is subsequently used to mask part of that wafer and thereby do away with the costly positioning associated with the use of photographic masks. The use of a portion of a device to mask another portion of the device is not new. The subject technique is novel however in that it utilizes the edge of a metal mesa as a mask. A much straighter and irregularity free edge may be maintained by the use of metal rather than semiconductor material. This is significant in the manufacture of high frequency devices where the uniformity of width of the gate region is critical.

DESCRIPTION OF THE PREFERRED EMBODIMENT

Figure 1:
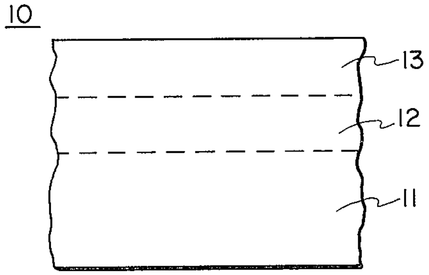
FIGS. 1 through 6 illustrate the structure of a flat wafer of semiconductor material at successive stages of its development into a field effect transistor.

FIG. 1 shows a semiconductor wafer of GaAs 10 consisting of two vapor phase epitaxial layers grown on a semi-insulating substrate 11. The two layers grown in situ consist of an n layer 12 with a donor density of approximately $8\times10^{16}cm^{-3}$ followed by an $n^+$ top layer 13 with a donor density of approximately $5\times10^{18}cm^{-5}$. The wafer is chemically prepared for metal deposition and placed under vacuum as quickly as possible following preparation. An evaporated ohmic contact approximately 1 micron thick consisting of Ti-Au 14 is then applied to the active $n^+$ side of the semiconductor wafer

Figure 2:
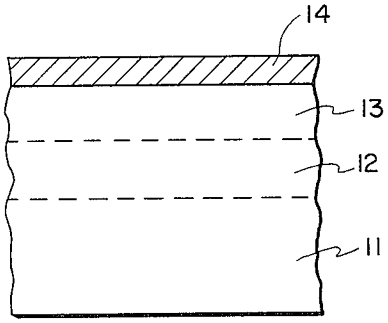
Figure 3:
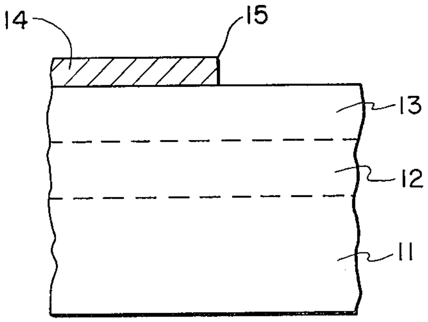
Figure 4:
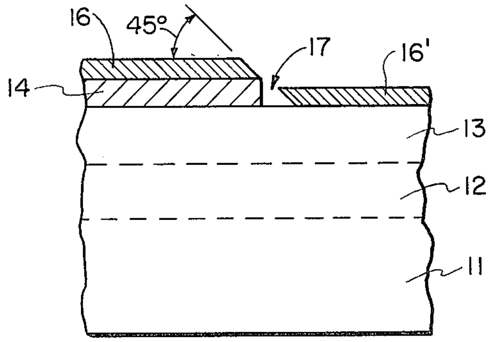
Figure 5:
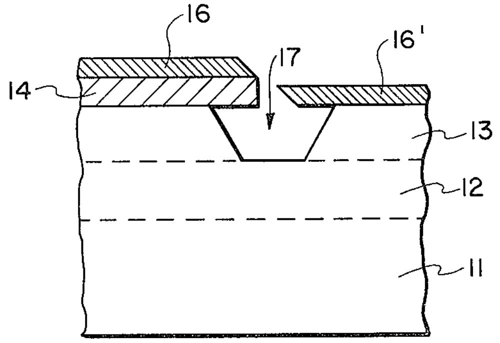
Figure 6:
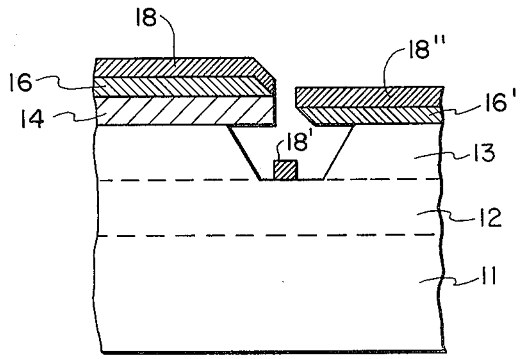

10 at a maximum pressure of $2\times10^{-7}$ torr (see FIG. 2). Following the metallization, part of the semiconductor wafer 10 is subjected to a photoresist application. The resist is exposed and developed and used to define a Ti-Au pattern with one relatively straight edge which forms a metal mesa 15 approximately 1 micron thick on the semiconductor wafer 10 (see FIG. 3). The semiconductor wafer 10 is then evaporated on again with metal 16 (16 and 16' represent the same evaporation deposited in different regions) except that it is tilted so that the plane of the semiconductor wafer 10 is at an angle of approximately 45° to the evaporation source with a straight edge of the mesa 15 on the far side of the source. Thus the semiconductor wafer 10 nearest the mesa 15 on the far side of the source of evaporation is shadowed and gets no metal 16 evaporated on it. A gap 17 therefore exists between the Ti-Au 14, 16, 16' where the semiconductor wafer 10 is exposed (see FIG. 4). The width of this gap 17 is dependent on the thickness of the original evaporation of Ti-Au 14 and the angle between the plane of the semiconductor wafer 10 and the source of evaporation. The semiconductor wafer 10 is then etched so that the gap 17 between the metal 14, 16, 16' is recessed (see FIG. 5). A third evaporation of metal 18 (18, 18' and 18'' represent the same evaporation deposited in different regions) is then performed with the plane of the semiconductor wafer 10 oriented approximately normal to the evaporating source. The metal from the third evaporation 18 condenses on the semiconductor wafer 10 in the gap 17 forming the gate region of the device. Parasitic capacitance increases as the thickness of the gate region approaches the depth of the gap 17 and the device will function less and less efficiently until the thickness of the gate region is equal to the depth of the gap and the device short circuits. While Ti-Au was used for all evaporations on the device described, it should be noted metals used in successive evaporations need not be identical in the general case.

What is claimed is:

1. The method of making a field effect transistor by a. providing a conductive metal mesa with at least one straight edge on one flat surface of a semiconductor wafer;

b. supporting the wafer adjacent to an evaporation source with its flat surface tilted relative to the source and with one straight edge on the far side of the mesa relative to the evaporation source so that the semiconductor region immediately adjacent to the one straight edge is shadowed by the straight edge relative to the evaporation source;

c. evaporating a film of conductive metal on the wafer whereby there is a film free gap alongside the straight edge;

d. stopping the evaporation and etching the semiconductor surface in the gap so that the semiconductor in the gap is then recessed;

e. positioning the wafer so that its surface is approximately normal to the source of evaporation and evaporating a metal film onto the wafer, and terminating the evaporation before there is a short circuit across the gap.

* * * * *